United States Patent [19]
Marx et al.

[11] Patent Number: 5,336,386
[45] Date of Patent: Aug. 9, 1994

[54] TARGET FOR CATHODE SPUTTERING

[75] Inventors: Daniel R. Marx, West Caldwell; Steven Hurwitt, Park Ridge, both of N.J.

[73] Assignee: Materials Research Corporation, Orangeburg, N.Y.

[21] Appl. No.: 967,458

[22] Filed: Oct. 28, 1992

Related U.S. Application Data

[63] Continuation of Ser. No. 647,288, Jan. 28, 1991, abandoned.

[51] Int. Cl.⁵ ............................................. C23C 14/34
[52] U.S. Cl. ............................ 204/298.12; 204/192.12; 204/298.09
[58] Field of Search ................ 204/192.12, 298.12, 204/298.09

[56] References Cited

U.S. PATENT DOCUMENTS

| | | | |
|---|---|---|---|
| 3,669,871 | 6/1972 | Elmgren et al. | 204/298 |
| 3,878,085 | 4/1975 | Corbani | 204/298 |
| 4,604,180 | 8/1986 | Hirukawa et al. | 204/298 |
| 4,622,121 | 11/1986 | Wegmann et al. | 204/298 |
| 4,668,373 | 5/1987 | Rille et al. | 204/298 |
| 4,747,926 | 5/1988 | Shimizu et al. | 204/298 |
| 4,842,703 | 6/1989 | Class et al. | 204/192.12 |
| 4,855,033 | 8/1989 | Hurwitt | 204/298 |
| 4,885,075 | 12/1989 | Hillman | 204/298.12 |

FOREIGN PATENT DOCUMENTS

| | | |
|---|---|---|
| 2651382 | 5/1978 | Fed. Rep. of Germany . |
| 3030329 | 2/1982 | Fed. Rep. of Germany . |
| 0232271 | 12/1984 | Japan . |
| 0136314 | 7/1985 | Japan . |
| 0024878 | 10/1985 | Japan . |
| 0200962 | 10/1985 | Japan . |
| 0099674 | 5/1986 | Japan . |
| 0183467 | 8/1986 | Japan . |
| 0007852 | 1/1987 | Japan . |
| 0211372 | 9/1987 | Japan . |
| 0211373 | 9/1987 | Japan . |
| 0057761 | 3/1988 | Japan . |
| 0128173 | 5/1988 | Japan . |
| 0153266 | 6/1988 | Japan . |
| 0235471 | 9/1988 | Japan . |
| 0238269 | 10/1988 | Japan . |
| 0075675 | 3/1989 | Japan . |
| 2209478 | 8/1990 | Japan .............................. 204/298.12 |

*Primary Examiner*—Nam Nguyen
*Attorney, Agent, or Firm*—Wood, Herron & Evans

[57] ABSTRACT

A sputtering target and target assembly includes a target member having a substantially continuously concave top surface and a bottom surface with a central, downwardly directed hub and at least three annular regions of differing radius of curvature. The shape of the target member bottom surface conforms to a backplate to which it is mounted, thereby facilitating accurate mounting of the target member during sputtering. The corresponding shapes of the target member and backplate promote maximum utilization of sputtering material.

4 Claims, 2 Drawing Sheets

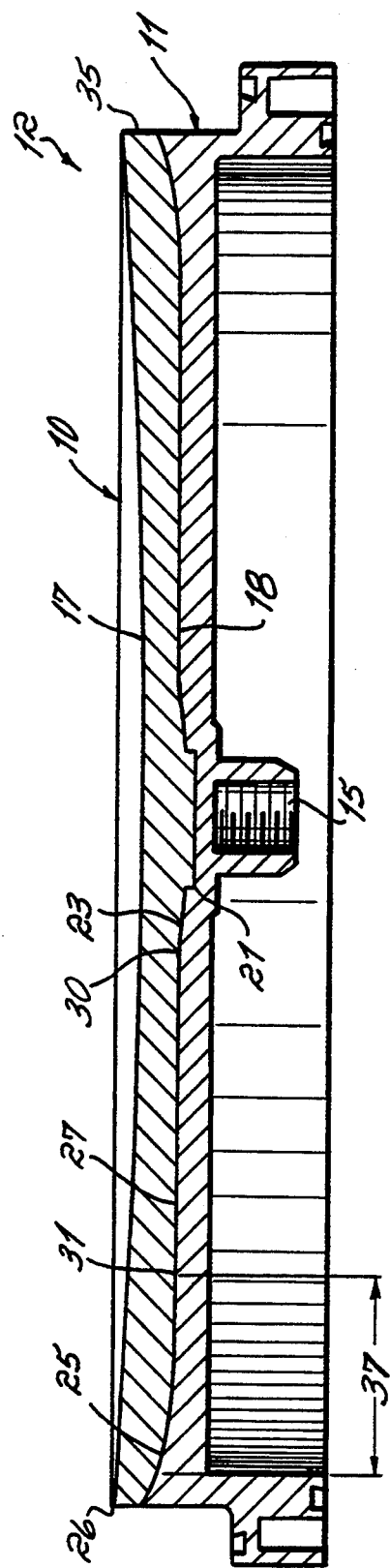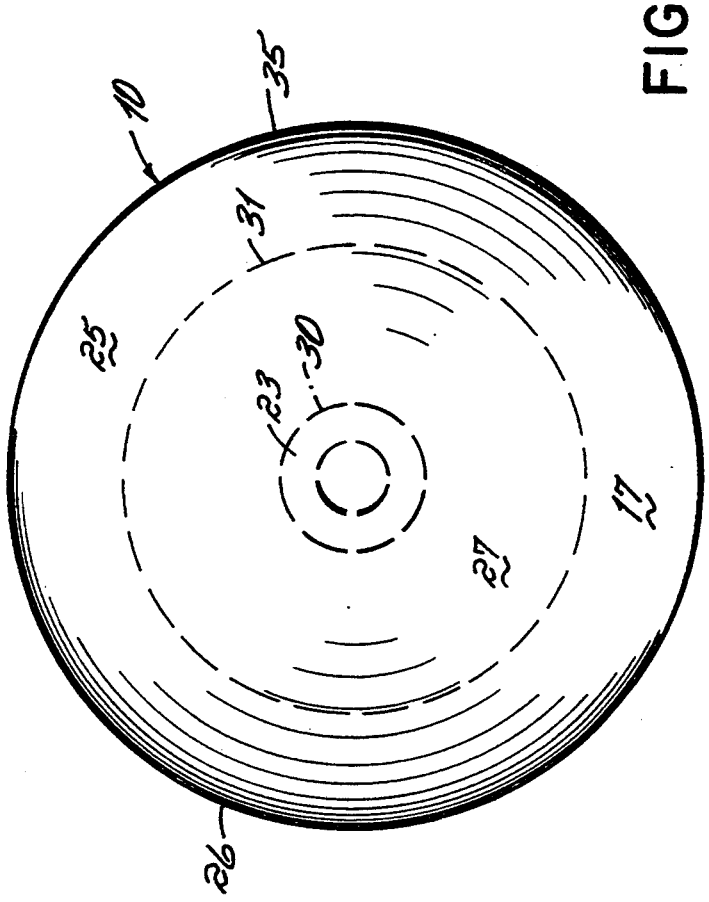

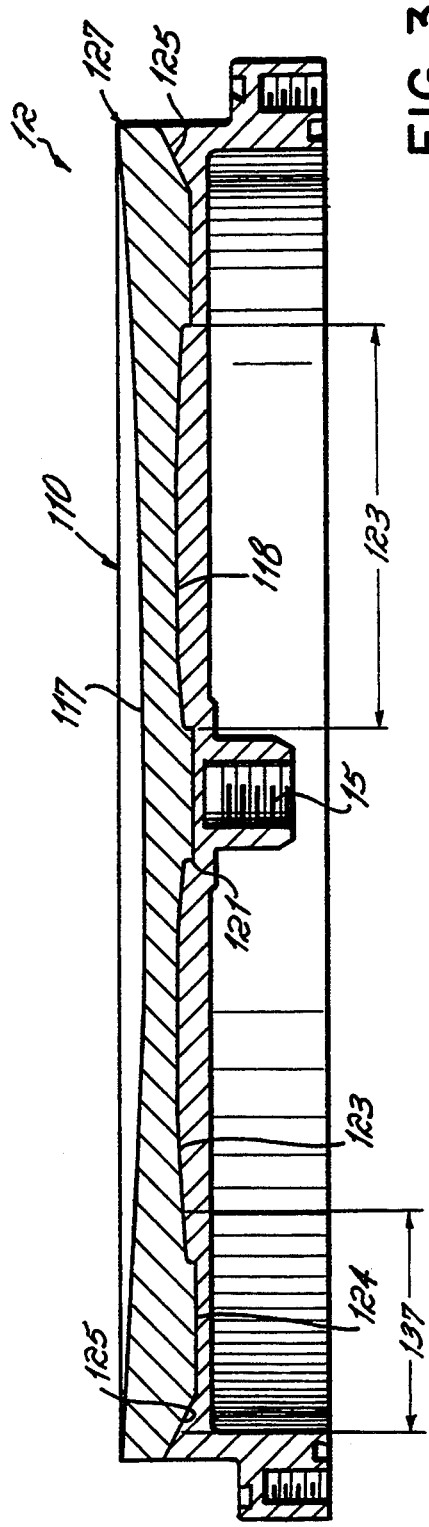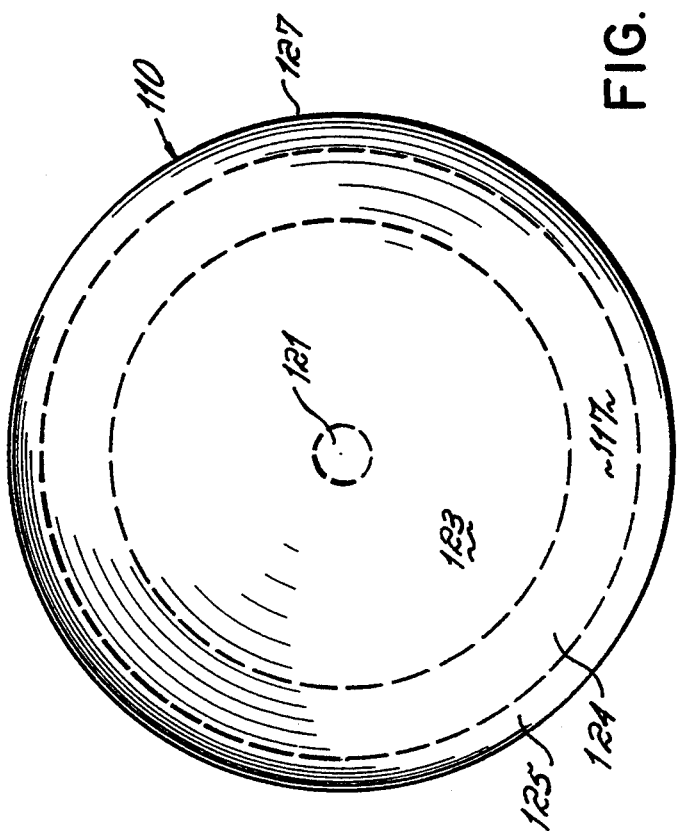

TARGET FOR CATHODE SPUTTERING

This is a continuation of applicant's U.S. application Ser. No. 07/647,288 entitled "TARGET FOR CATHODE SPUTTERING" which was filed on Jan. 28, 1991 now abandoned.

FIELD OF THE INVENTION

This invention relates to a target and target assembly for use in cathode sputtering.

BACKGROUND OF THE INVENTION

Cathode sputtering refers to a process which involves the coating of a wafer mounted within a processing chamber. An applied electric field positively biases the wafer with respect to an oppositely mounted, negatively biased target made of the material to be sputtered. A backplate supports the target. Upon introduction of an inert gas into the chamber at low pressure, the applied electric field ionizes the gas. As a result, positive ions from the gas bombard the target to cause sputtering of the target material onto the wafer. A magnet or electromagnet located behind the target provides a magnetic field above the wafer facing surface of the target to confine the ion "plasma" adjacent to the target. The magnetic field increases the efficiency of the sputtering process.

Some typical materials used in sputtering include aluminum alloys, gold, silver, copper, titanium, platinum, titanium-tungsten, and refractory metal silicides. Due primarily to the high purity required for sputtering, the costs of these sputtering materials is generally quite expensive, on the order of about $100 per pound of material. For this reason, maximum target material utilization is a major consideration in the design of sputtering equipment. Another important consideration relates to the effective coverage of trenches or via features of the wafer, either by planarizing an uneven surface or by adding another step-like layer. Some sputtering equipment employs a variation of the magnetic field, or multiple, non-planar erosion zones, or both, to coat wafer features in the desired manner.

In addition to maximum target utilization and effective coverage of a wafer surface, other practical considerations such as target mounting and cost of manufacture also play an important role in the design of sputtering equipment. While some target shapes may provide excellent step coverage or planarization, these advantages may be offset by the difficulty or cost associated with properly mounting the target to a backplate. For the most part, the machining of targets is difficult, expensive and time consuming. However, as a general rule, simpler shapes are easier to produce.

It is an object of this invention to provide a cathode sputtering target with high target material utilization capability and which is relatively easy to mount to a backplate.

It is another object of the invention to provide a sputtering target assembly that promotes maximum target utilization and ease in mounting without producing a corresponding sacrifice in effective wafer coverage or excessive manufacturing costs.

SUMMARY OF THE INVENTION

The invention contemplates a single piece target member adapted to be mounted to a target backplate with a predetermined mounting surface configuration, the member having a substantially continuously concave top surface and a bottom surface configured to conform to the predetermined mounting surface configuration of the backplate. The shape of the target facilitates mounting and promotes maximum target utilization.

The target member bottom surface includes a relatively shallow, central, downwardly directed hub that fits within a central recess in the backplate. Radially outwardly of the hub, the target member bottom surface includes at least three annular regions. In one preferred embodiment, the inner region, or region adjacent the hub, and the outer region, which lies adjacent a peripheral edge of the disc shaped target member, are both convex, while an intermediate region located therebetween is substantially flat. According to another preferred embodiment, the inner annular region is substantially concave, and the outer annular region is substantially convex and the intermediate annular region is flat.

The substantially continuously concave top surface provides sufficient versatility for achieving effective step coverage and planarization. The bottom surface construction creates increased cross-sectional thickness in portions of the target member wherein the highest concentration of sputtering occurs, or those portions that are eroded the most over the useful life of the target, thereby providing excellent target material utilization. Additionally, all of the annular regions of the bottom surface assist in centering the target member onto the backplate during mounting. On a relative scale, this target is easier to manufacture than many others. Overall, the shape promotes excellent target utilization and simplified mounting to a backplate, without sacrificing wafer coverage or required excessive production costs.

In addition to surfaces with a smooth, continuous curvature, the phrase "substantially continuously concave" also encompasses surfaces with a series of discrete steps to produce the overall same effect.

These and other features will be more readily understood in view of the following detailed description of the drawings.

BRIEF DESCRIPTION OF THE DRAWINGS

FIG. 1 is a cross-sectional view along a diameter of a sputtering target member in accordance with a first preferred embodiment of the invention.

FIG. 2 is a top plan view of the target member shown in FIG. 1.

FIG. 3 is a cross-sectional view along a diameter of a sputtering target member in accordance with a further preferred embodiment of the invention.

FIG. 4 is a top plan view of the target member shown in FIG. 3.

DETAILED DESCRIPTION OF THE INVENTION

FIG. 1 shows a concavo-convex target member 10 mounted to a backplate 11 that forms part of a cathode assembly 12 for use in a sputtering machine (not shown). The sputtering machine may be of the type shown in applicant's U.S. Pat. No. 4,909,695, which is expressly incorporated by reference herein in its entirety. The sputtering machine includes a wafer support (not shown) mounted to an anode above the target member 10, and a magnet assembly (not shown) located beneath the backplate 11. Central threads 15 in the bottom of the backplate 11 are sized to threadably connect to the cathode of the sputtering machine.

The target member 10 includes a substantially continuously concave top surface 17 and a bottom surface 18 that is bonded to the backplate 11. In one preferred embodiment designed to sputter coat 6" diameter wafers, the target member has a 10.00" diameter, and the top surface 17 has a preferable radius of curvature of about 67.00". The bottom surface 18 includes a central, relatively shallow, downwardly directed hub 21 and three annular regions located radially outwardly of the hub 21. An inner annular region 23 adjacent the hub 21 preferably has a radius of curvature of about 10.00". An outer annular region 25, located adjacent an edge 26 of the member 10, preferably has a lower radius of curvature, i.e., about 3.00". An intermediate region located therebetween 27 is substantially flat.

For a target member 10 with a diameter of 10.00 inches, the diameter of the hub 21 is preferably about 1.00 inch. An outer boundary 30 of the inner region 23 has a diameter of about 2.00 inches, and an outer boundary 31 of intermediate region 27 has a diameter of about 8.00 inches.

The target member 10 has a relatively uniform thickness of about 0.562 inches at the hub 21. Within region 23, the thickness of the target member 10 tapers to a minimum, at boundary 30. The thickness at the external edge 35 of the target member 10 is about 0.250 inches. The shapes and dimension of the top surface 17 and the bottom surface 18 provide an annular zone 37 which, generally, is thicker than the rest of the member 10, except for hub 21. Zone 37 is preferably located above the area of maximum magnetic field strength. Hub 21 and zone 37 promote maximum target utilization.

Depending upon the location and configuration of the magnetic field producing means, the target diameter, and the type of coverage desired, the relative diameters and the surface shapes of the annular regions of bottom surface 18 may be varied to move zone 37 either radially inwardly or outwardly.

For instance, according to another preferred embodiment of the invention, as shown in FIGS. 3 and 4, target member 110 includes a top surface 117 and a bottom surface 118 which has a hub 121 and annular regions 123, 124 and 125 located radially outwardly therefrom. Hub 121 is similar in shape and dimension to hub 21, shown in FIG. 1. Annular region 123 is substantially convex in shape and has an outer diameter of about 7.00". If desired, region 123 may be further broken down into an inner upwardly angled section (similar to region 23 of FIGS. 1 and 2), a middle flat section and an outer, downwardly angled section. Regardless of the specific shape, region 123 represents a substantially concave portion of bottom surface 118 that is located between hub 121 and the next radially outwardly located region, region 124.

Intermediate annular region 124 is substantially flat, extends beneath region 123 and has an outer diameter of about 9.00 inches. Region 124 lies in the same plane as hub 121, a plane that is located about 0.552" below uppermost edge 127 of the member 110.

Radically outward from region 124, an outermost annular region 125 angles upwardly to a location about 0.140" below edge 127. If desired, the angle may be varied slightly, either upward or downward, or the region 125 may be slightly convex. Similarly, while region 124 is preferably flat, it may also be either slightly convex or slightly angled. Together, regions 124 and 125 represent a substantially convex outer annular section of bottom surface 118. Zone 137 comprises all the volume above region 124 and adjacently residing portions of regions 123 and 125. Zone 137 represents an annular portion of the target member 110 that is generally thicker than then other portions, other than the hub 121. The overall effect produced by increased thickness at zone 137 and at hub 121 is the improvement in target material utilization at these inner and outer portions of the target.

For either embodiment, a different diameter target member would be used to coat a different diameter wafer. For instance, a 12" target would be used for an 8" wafer. For targets of different diameter, the hub diameter would remain the same while the diameters of the annular regions would be reduced proportionately in the remaining areas located annularly outward of the hub, assuming that the magnetic field was either unscaled or downscaled proportionately to provide maximum strength at the same relative locations above the target.

As shown in FIGS. 1 and 3, for either embodiment, the backplate 11 has a predetermined mounting surface configuration, and the target member bottom surface is configured to conform in shape to the predetermined mounting surface configuration of the backplate. This facilitates mounting and bonding of the target member 10 to the backplate 11 by the manufacturer.

While a preferred embodiment of the invention has been described, it is to be understood that the invention is not limited thereby and that in light of the present disclosure, various other alternative embodiments will be apparent to a person skilled in the art. Accordingly, it is to be understood that changes may be made without departing from the scope of the invention as particularly set forth and claimed.

I claim:

1. A sputter target assembly for a cathode comprising:

a backplate having upper and lower surfaces, the upper surface having a mounting surface configuration including a central recess surrounded by an outer annular substantially concave region with a radius of curvature $R_1$;

means for securing the backplate to the cathode, said means depending from the lower surface of the backplate; and a target adapted to be mounted to the backplate, the target having a substantially continuously concave top surface, said top surface having a radius of curvature $R_2$, said target further having a bottom surface complementarily configured to conform to said backplate mounting surface configuration and including a downwardly directed hub surrounded by an outer annular substantially convex region, the hub and the convex region sized and shaped to fit in the recess and the outer annular substantially concave region of the backplate, respectively, wherein $R_1$ is less than $R_2$ so as to define target portions of greater cross-sectional thickness in areas of maximum target erosion to promote maximum target utilization.

2. The assembly of claim 1 wherein said backplate has an inner annular concave region and said target bottom surface has a complementarily shaped inner annular convex region.

3. The assembly of claim 1 wherein said backplate has an inner annular convex region and said target bottom surface has a complementarily shaped inner annular concave region.

4. A sputter target assembly for a cathode comprising:
- a backplate having upper and lower surfaces, the upper surface having a mounting surface configuration with a central recess surrounded by an outer annular substantially concave region with a radius of curvature $R_1$;
- means for securing the backplate to the cathode, said means depending from the lower surface of the backplate; and
- a target adapted to be mounted to the backplate, the target having a top surface comprised of a series of steps to produce a substantially concave surface, said top surface having a radius of curvature $R_2$, said target further having a bottom surface complementarily configured to conform to said backplate mounting surface configuration and including a downwardly directed hub surrounded by an outer annular substantially convex region, the hub and the convex region sized and shaped to fit in the recess and the outer annular substantially concave region of the backplate, respectively, wherein $R_1$ is less than $R_2$ so as to define target portions of greater cross-sectional thickness in areas of maximum target erosion to promote maximum target utilization.

* * * * *